United States Patent [19]

Feuer et al.

[11] Patent Number: 5,657,148
[45] Date of Patent: Aug. 12, 1997

[54] APPARATUS AND METHOD FOR A SINGLE-PORT MODULATOR HAVING AMPLIFICATION

[75] Inventors: Mark D. Feuer, Colts Neck; Jay M. Wiesenfeld, Lincroft, both of N.J.

[73] Assignee: Lucent Technologies Inc., Murray Hill, N.J.

[21] Appl. No.: 646,169

[22] Filed: May 7, 1996

[51] Int. Cl.$^6$ .................................................. H01S 3/00
[52] U.S. Cl. .......................... 359/263; 359/170; 359/333
[58] Field of Search .................................. 359/170, 245, 359/248, 263, 333, 344, 347, 348, 341

[56] References Cited

U.S. PATENT DOCUMENTS

| | | | |
|---|---|---|---|
| 3,401,357 | 9/1968 | D'Asaro | 359/168 |
| 4,955,086 | 9/1990 | Kindt | 455/605 |
| 5,015,964 | 5/1991 | O'Mahony | 330/413 |
| 5,229,879 | 7/1993 | Gen-ei | 359/344 |
| 5,361,157 | 11/1994 | Ishikawa et al. | 359/168 |
| 5,414,726 | 5/1995 | Raj et al. | 372/26 |
| 5,434,702 | 7/1995 | Byron | 359/341 |

OTHER PUBLICATIONS

*High Frequency Modulation Of Strained Layer Multiple Quantum Well Optical Amplifiers*, by U. Koren et al., Electronic Letters, Jan. 3, 1991, vol. 27 No. 1, pp. 62–64.

*Modulation Properties Of A Near Traveling–Wave Semiconductor Laser Amplifier*, by L. Gillner, IEE Proceedings–J. vol. 139, No. 5, Oct. 1992, pp. 331–338.

*Silicon Modulator Based On Mechanically–Active Anti–Reflective Layer With 1 Mbit/sec Capability For Fiber–In–The–Loop Applications*, by K.W. Goosen et al., IEEE Photonics Technology Letters, vol. 6, No. 9, Sep. 1994, pp. 1119–1121.

Primary Examiner—Mark Hellner

[57] ABSTRACT

A single-port, reflective, optical modulator with internal amplification. In one advantageous embodiment of the present invention, the single-port modulator includes a semiconductor waveguide amplifier with a high reflector at one end. The single-port geometry reduces the high packaging cost associated with two-port modulators, while the internal amplification compensates for splitting and coupling losses. The single-port optical modulator generally includes an input/output port for receiving a light input signal. A modulation region for modulating the light input signal in response to an electrical drive signal is included along with an amplification region for providing amplification of the light input signal. The modulation region and the amplification region include a waveguide for directing the light input signal. A high reflector coupled at one end of the waveguide opposite the input/output port is operable to reflect the light input signal back toward the input/output port, wherein an amplified and modulated light signal is output therefrom.

34 Claims, 3 Drawing Sheets

APPARATUS AND METHOD FOR A SINGLE-PORT MODULATOR HAVING AMPLIFICATION

FIELD OF THE INVENTION

The present invention relates generally to optical communications systems, and more particularly to optical modulators for use in communications systems using optical fibers.

BACKGROUND OF THE INVENTION

Optical modulators have the ability to provide a reliable, cost-effective alternative to laser sources in remote terminals of optical communication networks. For example, modulators are particularly attractive in wavelength-division-multiplexed (WDM) systems, where strict requirements on frequency stability generally make laser-based remote terminals impractically expensive. In modulator-based networks, signals are generated by a light source (usually a laser) at a host terminal and distributed to remote terminals by a power splitter, wavelength router, or other means. These signals are then modulated at the remote terminals and returned to the host terminal either via the same fiber (bi-directional or duplex operation) or via a second, parallel fiber (unidirectional or simplex operation). A disadvantage of modulator-based networks is that transmission losses appear twice in the round-trip signal path, thus leading to limited power budgets for broadband systems.

Because cost targets are extremely stringent for remote terminals in local access networks, modulator packaging must minimize critical fiber alignments. Thus, single-port (reflection-mode) devices are generally preferred over two-port (transmission-mode) devices, wherein these devices should also be tolerant of fiber misalignment.

A number of modulator options exist in the prior art. Micro-mechanical modulators, for example, as described by Goossen et al. in "Silicon Modulator Based on Mechanically-Active Layer with 1 Mb/sec Capability for Fiber-in-the-Loop Applications," IEEE Photonics Technology Lett., vol. 6, pp. 1119–1121, 1994, are single-port, reflective modulators with an acceptable tolerance of fiber misalignment, and offer prospects for the narrowbad applications, but are limited in general to bitrates of a few Mb/s. Semiconductor Stark-effect modulators have better modulation bandwidth and can be operated in a single-port, normal-incidence package, but they can be undesirably wavelength- and temperature-sensitive. Conventional waveguide modulators in LiNbO3 or semiconductors have high modulation bandwidth, but require expensive two-port packaging with two independent fiber alignments made to single-mode tolerances. High bandwidth modulators with gain have been made by electrically switching semiconductor travelling-wave amplifiers as described by Koren et at. in "High Frequency Modulation of Strained Layer Multiple Quantum Well Optical Amplifiers," Electronics Lett., vol. 27, pp. 62–64, 1991, and Giliner in "Modulation Properties of a Near Travelling-Wave Semiconductor Laser Amplifier," IEE Proceedings-J, vol. 139, pp. 331–338, 1992, and the references cited therein. However, two-port packaging is still required with these devices. Accordingly, there is a need for a high performance optical modulator which provides gain without the high packaging costs associated with two-port devices.

SUMMARY OF THE INVENTION

The present invention is a single-port, reflective, optical modulator with internal amplification. In one advantageous embodiment of the present invention, the single-port modulator includes a semiconductor waveguide amplifier with a reflector at one end. The single-port geometry reduces the high packaging cost associated with two-port modulators, while the internal amplification compensates for network and coupling losses. The single-port optical modulator generally includes an input/output port for receiving a light input signal. A moaulation region for modulating the light input signal in response to an electrical drive signal is included along with an amplification region for providing amplification of the light input signal. The modulation region and the amplification region include a waveguide for directing the light input signal. A reflector coupled at one end of the waveguide opposite the input/output port is operable to reflect the light input signal back toward the input/output port, wherein an amplified and modulated light signal is output therefrom.

Other advantageous embodiments of the single-port optical modulator with amplification include: an electro-optic, interferometric modulator fabricated in LiNbO3 waveguide, with an amplifying region comprised of rare-earth-doped LiNbO3; a thermo-optic, interferometric modulator fabricated in silica or glass, with an amplifying region comprised of rare-earth-doped silica or glass; and a semiconductor amplifier operated with input and output beams perpendicular to the plane of the semiconductor wafer, with or without an index-guiding waveguide. As would be understood, other embodiments are encompassed within the spirit and scope of the present invention and are not limited to the specific examples given above.

BRIEF DESCRIPTION OF THE FIGURES

For a better understanding of the present invention, reference may be had to the following description of exemplary embodiments thereof, considered in conjunction with the accompanying drawings, in which.

DETAILED DESCRIPTION

Figure 1:
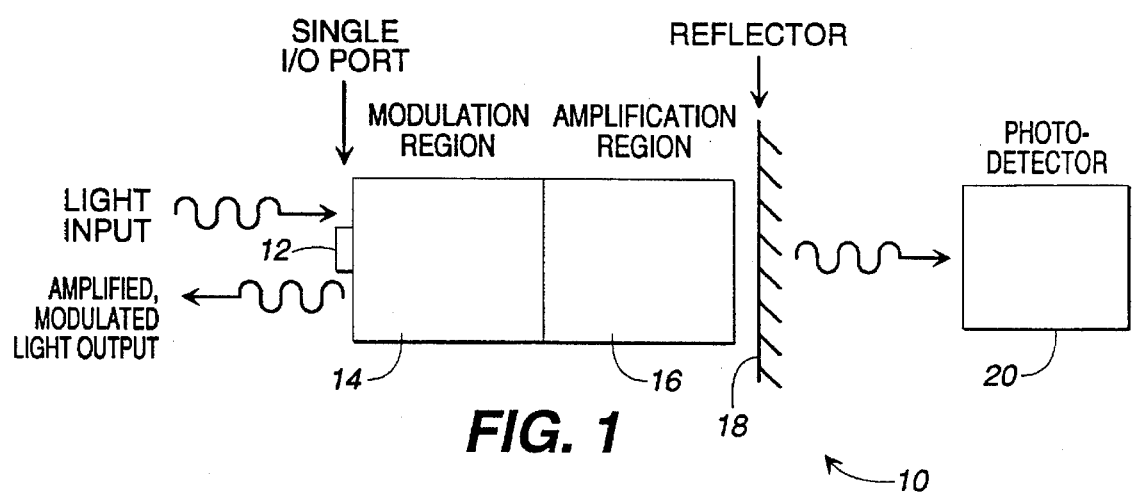
FIG. 1 shows a generalized block diagram of a single-port optical modulator with amplification according to the present invention.

Referring to FIG. 1, there is shown a generalized diagram of a single-port optical modulator 10 in accordance with the present invention. As shown, the optical modulator 10 of the present invention includes a single input/output (I/O) port 12 for receiving a light input from, for example, a fiber optic cable and outputting a modulated and amplified light signal. The I/O port may be provided with anti-reflection (AR) coatings, buffed facets, angled facets, and/or other means to suppress unwanted reflections. A modulation or switching region 14 and amplifying region 16 are coupled to the I/O port 12. A reflector region 18 is shown adjacent the amplifying region. As would be understood by a person skilled in the art, the switching region 14 and amplifying region 16 may be incorporated into a waveguide structure to concentrate and direct the light energy. The modulation region may include either amplitude or phase modulation.

Also, in some realizations, as would be understood, such as that of an active semiconductor waveguide, the switching and amplifying functions may be combined in a single region, as will be discussed in greater detail herein. Additionally, as shown in FIG. 1, the reflector 18 may be constructed to reflect less than 100% of the light, with a photo-receiver 20 located behind the reflector to provide for full integration of terminal functions. Alternatively, a partially-transmitting photodetection region may be incorporated between the amplifying region 16 and the reflector 18.

Additionally, an embodiment may include a phase modulator or other means for altering the optical path length traversed by the light signal, to provide dithering for control of phase coherence or pulse shape. As would be understood by a person skilled in the art, other regions for controlling or altering the light signal, such as filters, directional couplers, electro-absorption modulators, or other functional devices may be incorporated between the input/output port and the reflector, or may be operatively connected to the amplifying and/or modulating regions via optical waveguide.

Figure 2:
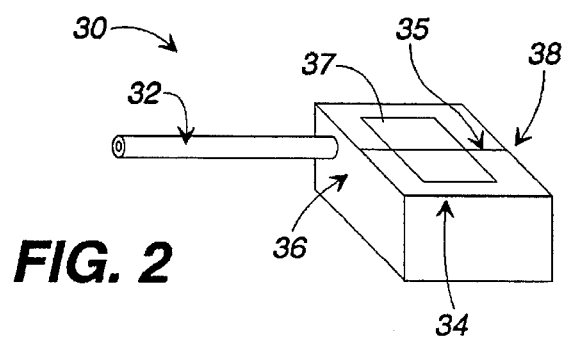
FIG. 2 shows one advantageous embodiment of single-port optical modulator with amplification in accordance with the present invention.

Referring to FIG. 2, there is shown one embodiment of the present invention single-port optical modulator with amplification 30 realized in an active semiconductor waveguide. As shown, the modulator 30 is a semiconductor laser amplifier modulator. In the shown embodiment, an input/output fiber port 32 is coupled to a single-section amplifier/modulator region 34. Contained within the amplifier/modulator region 34 is an active semiconductor waveguide 35 coupled to the input/output fiber port 32. As would be understood, the semiconductor region would include patterning in order to provide a high refractive index to the waveguide region. The amplifier/modulator region 34 of the shown embodiment includes an anti-reflective (AR) coated facet 36 on a side of that region coupled to the input/output fiber 32. A high-reflective (HR) coated facet 38 is included on the opposite side of the amplifier/modulation region 34. As is well-known, the AR and HR facet may be composed of a single or multi-layer dielectric coating with thickness and refractive index chosen to provide a desired reflective effect. Alternatively, the reflector could be realized as a waveguide reflector such as a waveguide grating, or as a thin mirror inserted into a gap in the waveguide, or as a mirror mounted on the end of the waveguide by a means which allows rapid movement of the mirror to provide phase dithering.

As would be understood by a person skilled in the art, optical modulation in the amplifier/modulation region 34 is achieved by adjusting the electrical drive signal to control the amplifier gain. Thus, modulation and amplification occur together in a single waveguide region. The electrical drive signal is applied to the active semiconductor waveguide 35 through an electrode 37 or other similar bias provider. As would be understood, individual electrical signals may also be applied to multiple electrodes for individual control of multiple separate regions providing gain, modulation, dithering, or other functions.

The photodetection function can be included in several ways. In the simplest, single-section device of FIG. 2, the current flowing through the amplifier/modulator region 34 has a component which is proportional to the input light level, so reception of an incoming optical signal is possible. This method may, however, require somewhat sophisticated circuitry to separate the small photocurrent produced by the incoming optical signal from the much stronger outgoing electrical signal applied to the modulator, and noise from the outgoing signal may degrade the sensitivity to the incoming signal.

Figure 3:
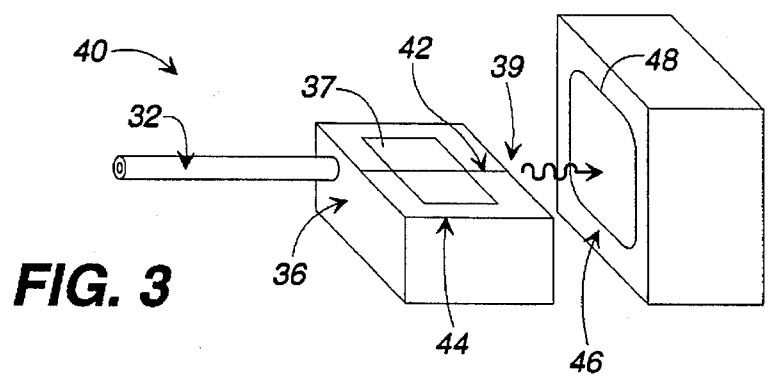
FIG. 3 shows a second embodiment of the present invention with hybrid integration of a photodetector.

To ease the burden on the receiver electronics, a separate photodetector may be used. This detector can be located on either side of the reflector as discussed with respect to FIG. 1. A hybrid solution is found in another embodiment of the present invention optical modulator 40 as shown in FIG. 3, combining a single-section amplifier/modulator 44 having an active semiconductor waveguide 42 and a separate photodetector chip 46 in a single package. Like components from the embodiment shown in FIG. 2 are given like numbers in the embodiment of FIG. 3. Adjacent a reflector facet 39 of the amplifier/modulator region 44 is a normal-incidence photodetector 46. One or more electrode regions 48 are also included on the photodetector 46 for application of a bias signal thereto and/or extraction of the detected signal. This hybrid solution allows individual optimization of the modulator and detector, does not require advanced photonic integration, and could use currently available laser packages designed to hold a back-face monitor diode.

Figure 4:
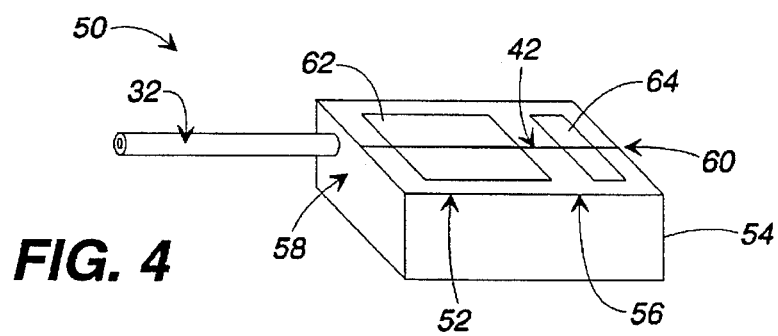
FIG. 4 shows a third embodiment of the present invention with monolithic integration of a photodetector.

Referring to FIG. 4, there is shown a third embodiment of a single-port optical modulator 50 having internal amplification, which includes a monolithically integrated photodetector region. In a similar fashion to the embodiment shown in FIG. 3, the embodiment of FIG. 4 includes an input/output optical port 32 coupled to an active semiconductor waveguide 42. In the shown embodiment, however, an amplifier/modulation region 52 and photodetector region 56 are included in a single semiconductor chip 54. An AR coated facet 58 is included on a first side of the single package device 54 coupled to the input/output fiber and a HR coated facet 60 is included on the opposite side of the device. As can be seen, the photodetector region 56 is located adjacent the amplifier/modulation region 52 and before the high reflector coated facet 60. As in the embodiment described in FIG. 2, electrodes 62, 64 are included in the amplifier/modulation region 52 and the photodetector region 56, respectively, to enable application of a drive signal and the extraction of a detected signal.

Coherence control for suppression of optical interference in bi-directional links can also be achieved with the semiconductor laser amplifier modulators 34, 52 shown in FIG. 3 and FIG. 4. The phase shift imparted to the light signal by the amplifying waveguide varies with the drive signal, so optical phase dither of the outgoing signal can be obtained by dithering the electrical drive signal. Control circuits for providing an oscillation of small amplitude to overcome, for example, certain undesirable effects to an output signal are well known devices that accomplish dithering. Since some incidental amplitude modulation will accompany the phase dither, the dither signal must be at a frequency outside the pass band of the receiver.

The embodiments shown in FIG. 3 and FIG. 4 resemble certain travelling wave modulators, with the addition of a reflector to achieve single-port operation. This addition makes the devices a cost-effective, high-performance option for optical communication networks. Electrical switching of the gain medium yields ample modulation bandwidth and excellent extinction ratio. In addition, a broad range of operating wavelengths is handled by a single device, as needed for WDM networks. Additionally, the output signal is at substantially the same wavelength as the input signal, so that no optical filter is required to differentiate between output signal and reflected input signal.

Figure 5:
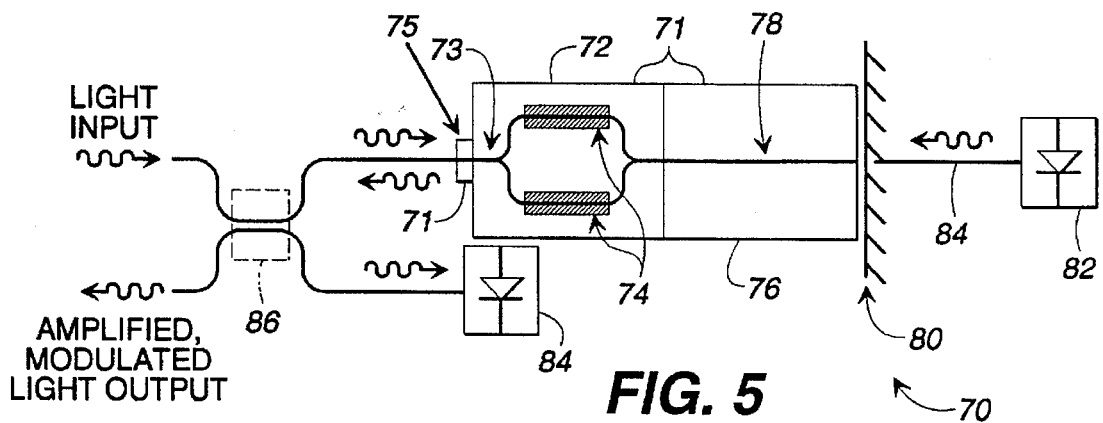
FIG. 5 shows a fourth embodiment of the optical modulator of the present invention, where the amplifier is an Er-doped waveguide and the amplification region is optically pumped through a dichroic reflector.

Referring to FIG. 5, there is shown a fourth embodiment of a single-port optical modulator 70 with amplification realized in a two-stage dielectric waveguide 71. A first stage of the dielectric waveguide, the modulation region 72, is an electro-optic modulator, such as a Mach-Zehnder interferometric device fabricated in LiNbO3 (lithium niobate). The modulation region 72 includes a non-amplifying waveguide 73, wherein a signal received through the I/O port 75 is modulated by means of an electrical signal applied to modulator bias electrodes 74 in the modulation region as shown. The second stage 76 of the waveguide is an amplifying waveguide 78, such as a LiNbO3 waveguide which has been doped with suitable rare-earth ions, such as erbium ions. As would be understood, amplification of the optical signal is accomplished by means of appropriate pumping of the amplification region with light of a certain wavelength. A reflector 80, for example, a dichroic reflector, is coupled to the amplification region 76 opposite the receiving end. In this dielectric structure, the amplifier would ordinarily be optically pumped, by introducing light of a pump wavelength (different from the signal wavelength) into the amplifier waveguide by means of a pump laser 82 or other light source. The pump light may be introduced through the reflector 80 if the reflector is a dichroic mirror which reflects at the signal wavelength and transmits at the pump wavelength. As would be understood, alternative means of introducing the pump light might be a waveguide coupler integrated on the modulator chip (not shown in the figure) or a separate device, such as a fused fiber wavelength-division-multiplexing coupler. Although the modulator is shown adjacent to the I/O port and the amplifier is shown adjacent to the reflector, it would be understood by a person skilled in the art that reversed positions, or combination of amplification and modulation functions in a single region may be desirable for some applications.

In addition to amplitude modulation, the embodiment shown in FIG. 5 can also provide phase dither for suppression of optical interference in bi-directional links. This is achieved by applying a common voltage to the two electrodes 74 to obtain phase modulation while applying a differential voltage between the two contacts for amplitude modulation. A directional coupler 86 is also shown in FIG. 5 for receiving a light input and directing it towards the I/O port 75 and/or an optional photodetector 84. The directional coupler 86 is also responsible for directing amplified, modulated light output from the device.

For cost, polarization dependence, optical coupling efficiency or other reasons, it may be desirable to construct the single-port optical modulator with amplification in silica glass or another non-electro-optic material. In this case, it may be desirable to replace the electro-optic modulator discussed with respect to the previous embodiments with a thermo-optic modulator. The thermo-optic modulator may be a Mach-Zehnder interferometric device in which the change in path length of one arm is achieved by changing its temperature with a local micro-heater, instead of through the electro-optic effect. Thermo-optic modulators are relatively slow, so it may be difficult to obtain phase dither at rates high enough for effective coherence control.

Figure 6:
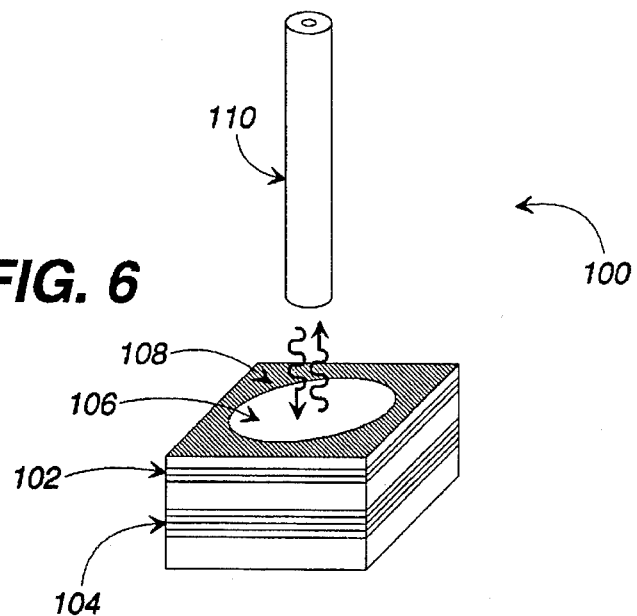
FIG. 6 shows a fifth embodiment of the optical modulator of the present invention, where the amplifier is a semiconductor amplifier operated with input and output beams perpendicular to the plane of the semiconductor layers, without an index-guiding waveguide.

Referring to FIG. 6, there is shown a fifth embodiment of a single-port optical modulator 100 with amplification realized as a vertical-incidence semiconductor amplifier/modulator. In this embodiment, the amplification and modulation regions are combined into a single region 102, comprising one or more semiconductor layers which produce gain when biased. Unlike the embodiment of FIG. 2, the light signal propagates perpendicular to the semiconductor layers which form the gain region. The reflector is composed of a series of semiconductor layers 104, known in the art as a Bragg reflector, which produces a high reflectivity by multiple-beam interference. The distance traversed by the light signal is short, allowing efficient operation without any waveguide, as shown. The input/output port 106 shown adjacent the bias electrode 108 is wide and has no waveguide to define a small aperture, so there can be a wide latitude in the positioning of the input fiber 110 or other optics, allowing inexpensive packaging to be used. Alternatively, it may be desirable to combine the Bragg reflector with the amplification and/or modulation regions.

The short distance traversed by the light signal may limit the gain available per pass. If so, a partial reflector at the input/output port will provide multipass operation to increase the gain to the desired level. Additional layers added to the semiconductor stack, with appropriate additional electrodes, can provide an integrated photodetector.

Figure 7:
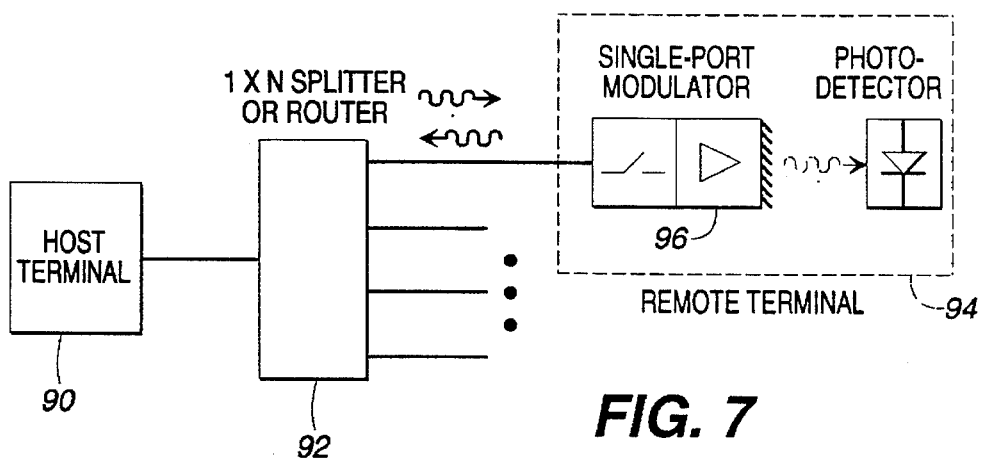
FIGS. 7 and 8 show exemplary utilizations of the present invention single-port optical modulators in a network environment.
Figure 8:
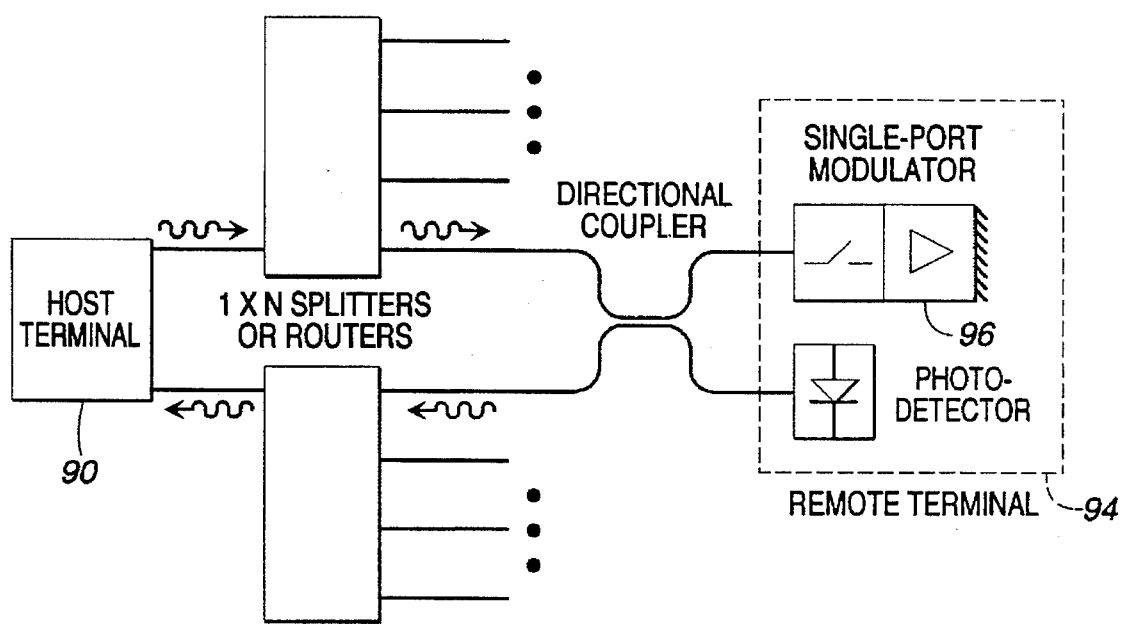

FIGS. 7 and 8 illustrate some exemplary utilizations for the single-port modulator of the present invention. As shown in FIG. 7, the devices may be included, for example, in a Star network, wherein signals from a host terminal 90 may be routed through a 1×N splitter 92 or router to a remote terminal 94, where the single-port modulator device 96 is used in bi-directional (duplex) transmission. The single port devices may also be used in unidirectional (simplex) transmission between a host terminal 90 and remote terminal 94, as shown in FIG. 8.

The present invention single-port optical modulator can be packaged in presently available commercial laser packages, achieving significant cost savings both from reduced fiber alignments and from high-volume manufacturing. The amplifier gain can be used to overcome coupling losses, thereby improving alignment tolerance, or to add power margin to the network, if desired. If enough amplification is used, the allowed transmission loss of the modulator-based network can be nearly doubled, achieving performance similar to that of a laser-based network.

Bidirectional transmission in modulator-based networks can suffer from optical interference, however, due to network reflections or Rayleigh scattering, so special measures are needed to control coherence of the upstream and downstream signals. For example, provisions for rapid phase dither of the upstream signal might be incorporated into the modulator, as discussed.

Figure 9:
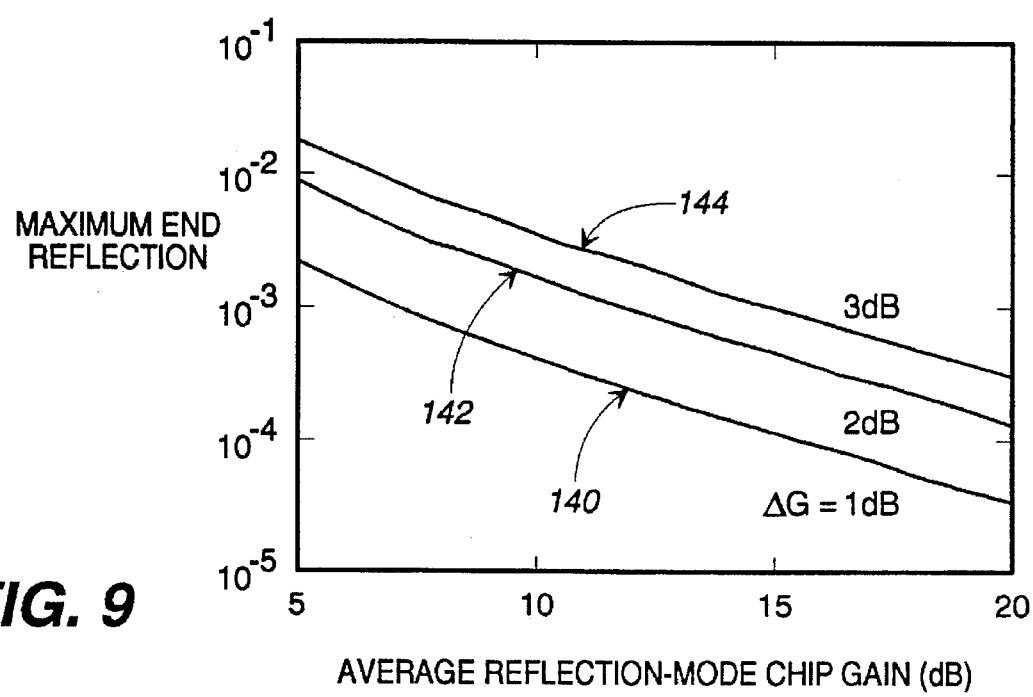
FIG. 9 shows the required end reflection of the input/output facet of a semiconductor laser amplifier versus the reflection-mode gain of the amplifier for different levels of gain ripple.

Also, practical limits on the gain used in the modulators will arise from Fabry-Perot resonances in the cavity formed by the reflector and unintentional reflections at the I/O port. These resonances can cause wavelength dependence of the gain, an undesirable feature for most systems. Theoretical calculations predict, and experiments confirm, that levels of unintentional reflection at the I/O port can be low enough to achieve useful gain ripple of 1–3 dB. FIG. 9 shows the level of reflectivity, or maximum end reflection, required at the I/O port for a given reflection-mode gain for a semiconductor laser amplifier. Curves 140, 142 and 144 show required reflectivities for gain ripples of 1-dB, 2-dB and 3-dB, respectively.

From the above, it should be understood that the embodiments described, in regard to the drawings, are merely exemplary and that a person skilled in the art may make variations and modifications to the shown embodiments without departing from the spirit and scope of the invention. For example, the present invention single-port modulator with amplification may be incorporated as one or more single integrated circuits or as part of a larger, more complex, photonic integrated circuit, as would be understood by a person skilled in the art. All such variations and modifications are intended to be included within the scope of the invention as defined in the appended claims.

What is claimed is:

1. A single-port optical modulator apparatus for use in an optical communications system, said apparatus comprising:
   a substantially non-reflecting input/output port for receiving a light input signal;
   a modulation region for modulating said light input signal in response to an electrical drive signal;
   an amplification region for providing amplification of said light input signal; and
   a single reflector operable to reflect said light input signal back toward said input/output port, wherein an amplified and modulated light signal is output therefrom.

2. The apparatus of claim 1, further including a photodetector for detecting levels of said light input signal.

3. The apparatus of claim 1, further including a phase modulator for modifying the coherence of said light output signal.

4. The apparatus of claim 1, wherein said amplification region comprises a semiconductor material.

5. The apparatus of claim 1, wherein said modulation region comprises a semiconductor material.

6. The apparatus of claim 1, wherein said modulation region and amplification region are combined in a single region, comprising a semiconductor material, wherein modulation and amplification occur together in said semiconductor material in response to said electrical drive signal.

7. The apparatus of claim 6, including a waveguide for directing said light signal.

8. The apparatus of claim 7, wherein said waveguide is an active semiconductor waveguide and said modulation region and amplification region are combined in said semiconductor waveguide.

9. The apparatus of claim 8, further including a photodetector being monolithically integrated with said single region to thereby provide a single section device.

10. The apparatus of claim 8, further including a photodetector comprising another waveguide region electrically isolated from said waveguide of said modulation region and said amplification region.

11. The apparatus of claim 6, wherein the input light signal propagates perpendicular to the semiconductor layers which compose said modulation and amplification regions.

12. The apparatus of claim 1, wherein said modulation region is an electro-optic modulator.

13. The apparatus of claim 12, wherein said electro-optic modulator is an interferometric device.

14. The apparatus of claim 1, wherein said modulation region is fabricated in LiNbO3.

15. The apparatus of claim 1, wherein said amplification region includes an amplifying waveguide doped with rare-earth ions.

16. The apparatus of claim 15, wherein said rare earth ions are erbium.

17. The apparatus of claim 16, wherein said amplification region is fabricated in LiNbO3.

18. The apparatus of claim 1, wherein said reflector is a dichroic reflector, further including a pump laser coupled to said reflector for introducing light of a pump wavelength different from a signal wavelength into said waveguide.

19. The apparatus of claim 1, wherein said modulation region is coupled to said input output/port and said amplification region is coupled to said modulation region.

20. The apparatus of claim 1, wherein said amplification region is coupled to said input/output port and said modulation region is coupled to said amplification region.

21. The apparatus of claim 1, wherein said single-port optical modulator is adapted for packaging in a single-port laser package.

22. A single-port optical modulator apparatus for use in an optical communications system, said apparatus comprising:
   an input/output port for receiving a light input signal;
   a modulation region for modulating said light input signal in response to an electrical drive signal;
   an amplification region for providing amplification of said light input signal; and
   a reflector operable to reflect said light input signal back toward said input/output port, wherein an amplified and modulated light signal is output therefrom, and wherein said modulation region includes a thermo-optic modulator.

23. The apparatus of claim 22, wherein said amplification region is fabricated in glass material.

24. The apparatus of claim 22, wherein said thermo-optic modulator is an interferometric device.

25. An integrated circuit including a single-port optical modulator for use in an optical communications system, said integrated circuit comprising:
   a substantially non-reflecting input/output port for receiving a light input signal;
   a modulation region for modulating said light input signal in response to an electrical drive signal;
   an amplification region for providing amplification of said light input signal; and
   a single reflector operable to reflect said light input signal back along its original path toward said input/output port, wherein an amplified and modulated light signal is output therefrom.

26. The integrated circuit of claim 25, further including a photodetector for detecting levels of said light input signal.

27. The integrated circuit of claim 25, wherein said modulation region and amplification region are combined in a single region, comprised of semiconductor material, wherein modulation and amplification occur together in said semiconductor material in response to said electrical drive signal.

28. The integrated circuit of claim 25, including a waveguide for directing said light signal.

29. The integrated circuit of claim 28, wherein said waveguide is an active semiconductor waveguide and said modulation region and amplification region are combined in said semiconductor waveguide.

30. A method for operating an optical modulator in an optical communications network, said method comprising the steps of:
   receiving a light input signal at a substantially non-reflecting input/output port of a single-port optical modulator;
   modulating said light input signal in response to an electrical drive signal;
   amplifying said light input signal; and reflecting said light input signal from a single reflector back toward said input/output port, wherein an amplified and modulated light signal is output therefrom.

31. The method of claim 30, wherein said modulation and amplification occur together in a semiconductor waveguide in response to said electrical drive signal.

32. The method of claim 30, further including the step of detecting levels of said light input signal at a photodetector.

33. A single-port optical modulator apparatus for use in an optical communications system, said apparatus comprising:
   an input/output port for receiving a light input signal;
   a modulation region for modulating said light input signal in response to an electrical drive signal;
   an amplification region for providing amplification of said light input signal; and
   a reflector operable to reflect said light input signal back toward said input/output port, wherein an amplified and modulated light signal is output therefrom, said apparatus further including a photodetector for detecting levels of said light input signal.

34. A single-port optical modulator apparatus for use in an optical communications system, said apparatus comprising:
   an input/output port for receiving a light input signal;
   a modulation region for modulating said light input signal in response to an electrical drive signal;
   an amplification region for providing amplification of said light input signal; and
   a reflector operable to reflect said light input signal back toward said input/output port, wherein an amplified and modulated light signal is output therefrom, said apparatus further including a phase modulator for modifying the coherence of said light output signal.

* * * * *